United States Patent [19]

Kittler

[11] Patent Number: 4,917,963
[45] Date of Patent: Apr. 17, 1990

[54] GRADED COMPOSITION PRIMER LAYER

[75] Inventor: Wilfred C. Kittler, Thousand Oaks, Calif.

[73] Assignee: Andus Corporation, Canoga Park, Calif.

[21] Appl. No.: 264,287

[22] Filed: Oct. 28, 1988

[51] Int. Cl.[4] ........................ B32B 15/04; C23C 14/14
[52] U.S. Cl. .................................... 428/610; 428/621; 428/626; 428/630; 428/666; 428/674; 428/675; 428/901; 204/192.15; 204/192.17
[58] Field of Search ............... 428/610, 621, 626, 630, 428/666, 674, 675, 901; 204/192.15, 192.17

[56] References Cited

U.S. PATENT DOCUMENTS

| | | | |
|---|---|---|---|
| 3,097,329 | 7/1963 | Siemens | 428/610 |
| 3,324,019 | 6/1967 | Laegreid et al. | 204/197.25 |
| 3,530,055 | 9/1970 | Maissel et al. | 204/192.12 |
| 4,035,276 | 7/1977 | Havas et al. | 204/192.12 |
| 4,060,471 | 11/1977 | Pinch et al. | 204/192.15 |
| 4,322,276 | 3/1982 | Meckel et al. | 204/192.26 |
| 4,512,863 | 4/1985 | Criss et al. | 204/192.15 |
| 4,731,172 | 3/1988 | Adachi et al. | 204/192.26 |

FOREIGN PATENT DOCUMENTS 60-89566 5/1985 Japan .

OTHER PUBLICATIONS

Hoitt et al., "Metalized Film Flex Circuits Yield Fine Lines," Electronic Packaging & Production, Jun. 1988.
Coutts, Thin Solid Films 4, (1969).
Campbell, "Mechanical Properties of Thin Films", Handbood of Thin Film Tech., Maissel & Glang, Eds., Chapt. 12 (mcGraw Hill 1970).
McIntyre et al., J. Vac. Sci. Technol. A6, 1708 (1988).

Primary Examiner—L. Dewayne Rutledge
Assistant Examiner—George Wyszomierski
Attorney, Agent, or Firm—Yuan Chao; Edith A. Rice; Herbert G. Burkard

[57] ABSTRACT

Bonding between a metallic conductor and a substrate is improved by using a primer layer having a graded composition which continuously varies from a composition predominant in a metal which bonds well to the substrate at the substrate-primer layer interface to a composition predominant in the metal of the conductor at the conductor-primer layer interface. Specifically, the bonding characteristics of copper to polyimide substrate are improved by using a chromium-copper graded composition primer layer which is chromium-rich at the substrate-primer layer interface and copper-rich at the conductor-primer layer interface.

21 Claims, 4 Drawing Sheets

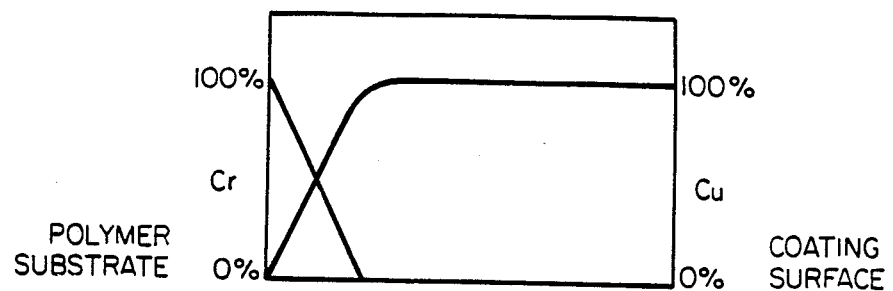
FIG_1
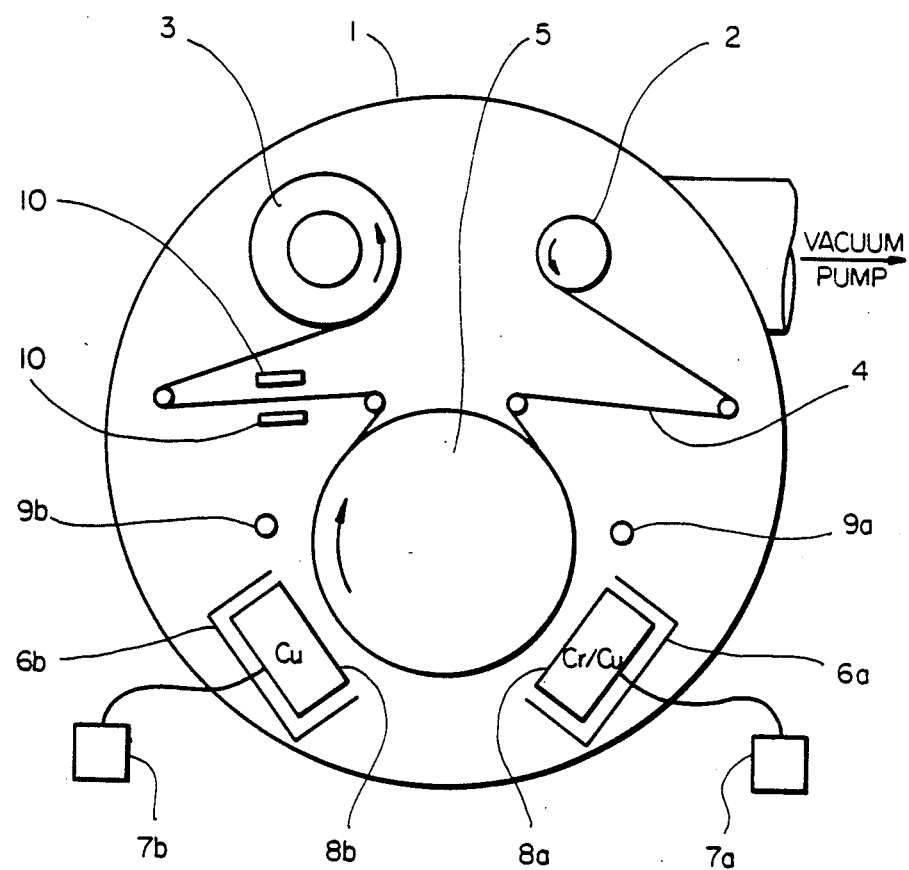
FIG_2

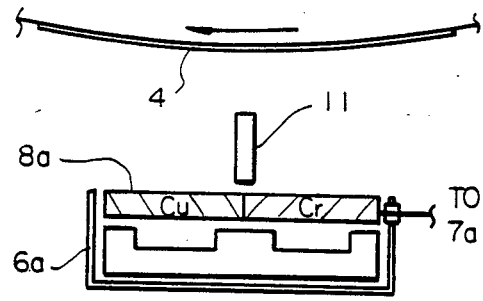
FIG_2a
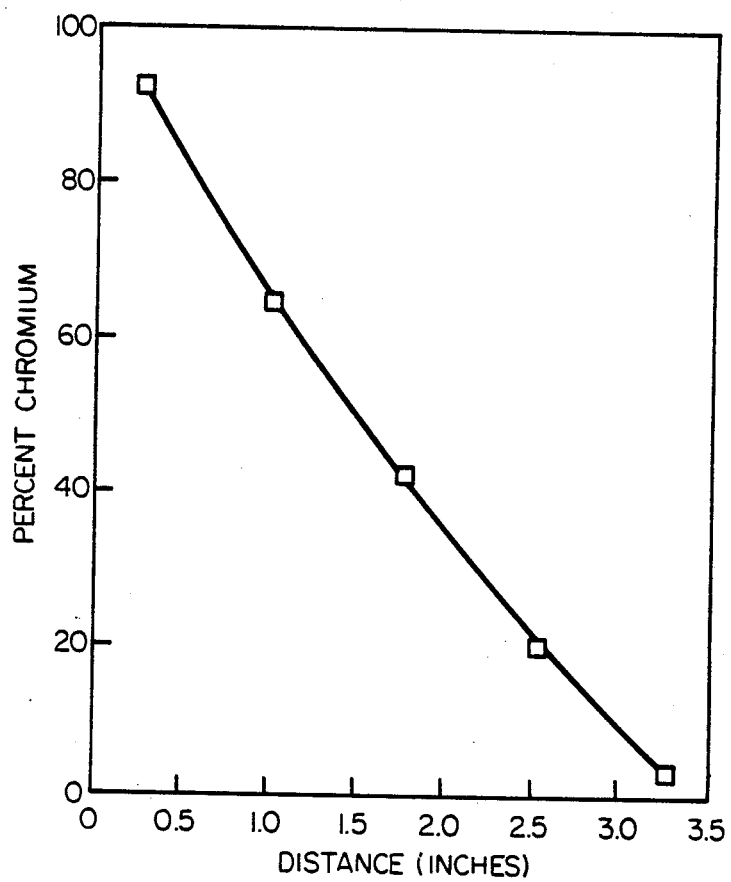
FIG_3

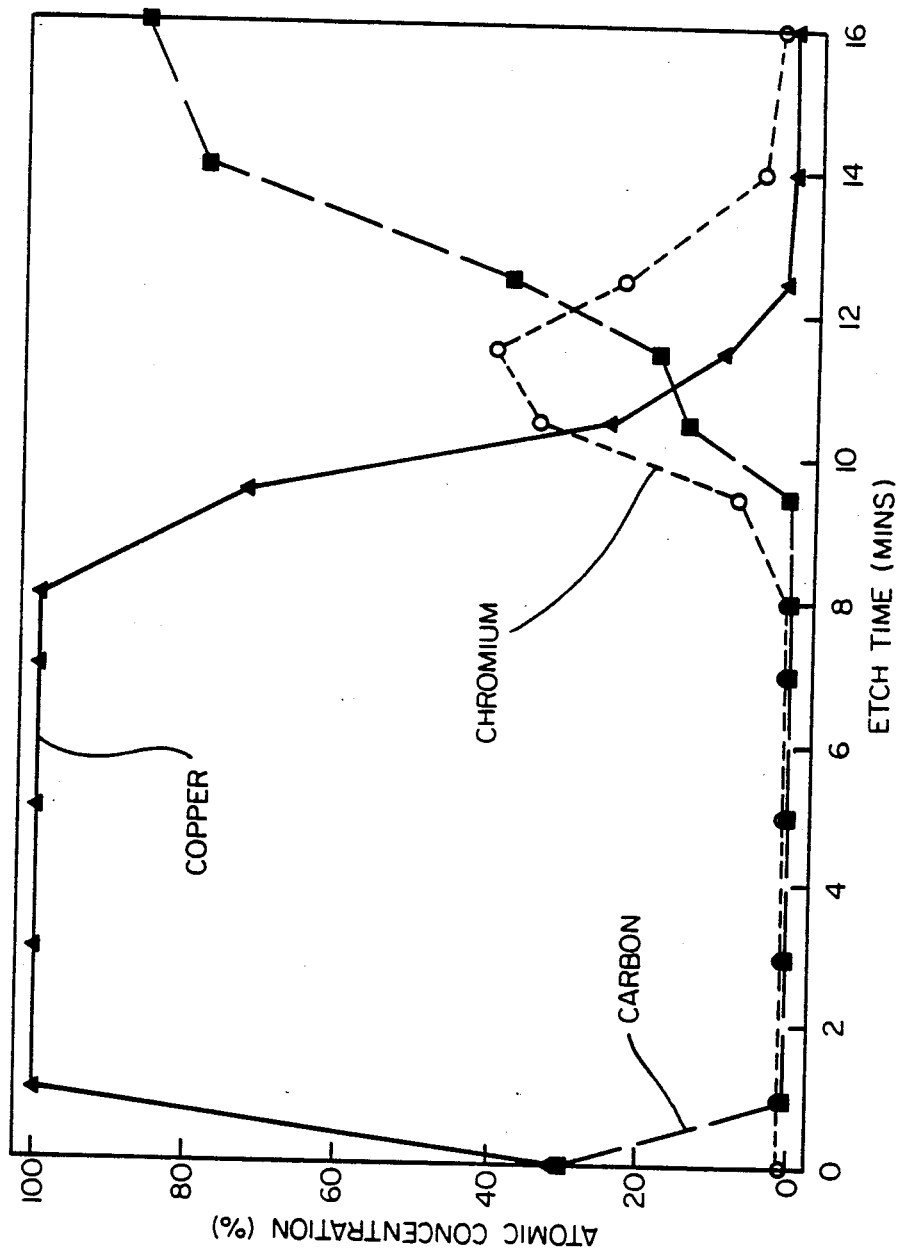
FIG_4

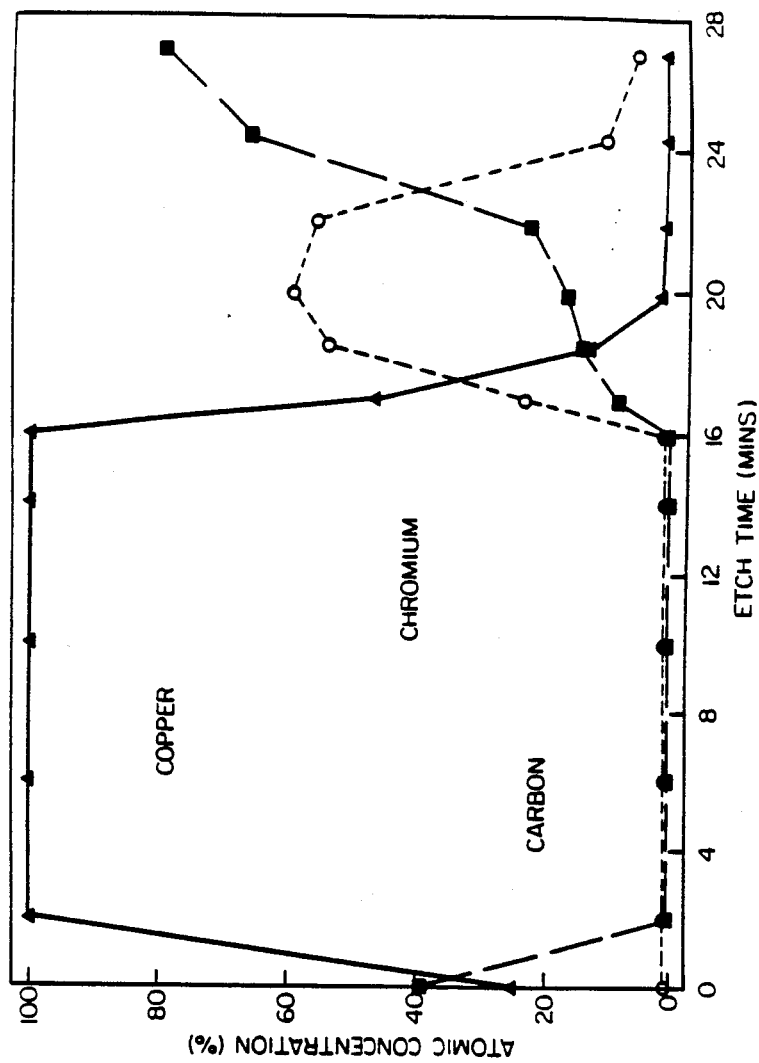
FIG_5 (Prior Art)

GRADED COMPOSITION PRIMER LAYER

BACKGROUND OF THE INVENTION

This invention relates to a graded composition primer layer for improving the bonding characteristics of a conductor to a substrate and to methods therefor.

Flexible "printed" circuitry is useful in the fabrication of lightweight electronic assemblies. Typically, a thin foil of a conductor such as copper is carried on a substrate made of a dielectric material, such as polyimide. Conductor-on-substrate assemblies are also used in rigid circuit boards and integrated semiconductor chip carriers.

It is known to fabricate conductor-on-substrate assemblies by adhesively laminating a thin foil of the conductor onto the substrate. However, adhesively bonded assemblies are performance-limited in a number of respects. The adhesive's outgassing and physical limitations (e.g., brittleness at low temperatures, loss of mechanical properties or instability at high temperatures) may preclude use of these assemblies in demanding environments, such as those involving exposure to high vacuum, high humidity, and/or temperature extremes. Dimensional variations in the adhesive caused by temperature fluctuations may be unacceptable where dimensional tolerances are critical.

It has been proposed to prepare adhesiveless assemblies by direct deposition of the conductor onto the substrate by electroless deposition or vacuum deposition, leading to a direct conductor-to-substrate bond. With either deposition method, the strength and durability of the bond between the conductor and the substrate is critical to the integrity of the product. In electroless deposition, aggressive chemical treatment is used to promote adhesion and prepare the surface for plating.

Vacuum deposition techniques represent an alternative to electroless deposition. Magnetron sputtering is a preferred vacuum deposition technique because high deposition energies and good bond strengths can be attained. The conductor may be sputtered directly onto the substrate. In some applications, it may be desirable to use a primer or adhesion promoting layer between the conductor and the substrate. For example, it has been proposed to use a primer layer of chromium between the copper conductor and polyimide substrate. It is believed that the chromium enables the formation of a stronger adhesive bond to the polyimide surface, preventing attack on the interface by plating and etching chemicals used in subsequent processing.

However, the primer layer itself can induce failure of a different nature, again resulting in limitations in performance capabilities. For example, a copper/chromium/polyimide construction prepared by magnetron sputtering was found to have an excellent chromium-to-polyimide bond. However, upon testing in a 60° C./90% relative humidity environment, failure at the copper/chromium interface was observed, although the chromium/polyimide bond appeared to remain intact. It is believed that this failure is attributable to the mutual insolubility of copper and chromium under the test conditions, so that there was oxidation of the chromium and consequent failure of the bond to the copper.

It has also been proposed to solve the problem of interfacial debonding resulting from oxidation of the adhesion layer by using Nichrome (an 80:20 Ni:Cr alloy) as an adhesion layer for copper. While the Nichrome layer does improve the adhesion of the copper, Nichrome is incompatible with certain plating chemistries and requires non-standard etchants for etching it, and is therefore not generally favored.

SUMMARY OF THE INVENTION

The present invention provides a graded composition primer layer for improving the bonding characteristics of a substrate to a conductor made of a first metal, comprising the first metal and a second metal which is different from the first metal and having a composition which continuously varies from a predominance of the first metal at the surface facing the conductor to a predominance of the second metal at the surface facing the substrate.

This invention also provides an assembly of a conductor supported by a substrate, comprising a substrate, the aforementioned primer layer bonded to the substrate at its second metal predominant surface, and a conductor bonded to the primer layer at its first metal predominant surface.

This invention further provides a method of making the aforementioned assembly, comprising the steps of providing a substrate, depositing thereon the aforementioned primer layer with its second metal predominant surface facing the substrate, and depositing on the primer layer a conductor.

BRIEF DESCRIPTION OF THE DRAWINGS

FIG. 1 shows a representative compositional profile for a graded composition primer layer of this invention in combination with a conductor layer.

FIG. 2 shows schematically a sputter coater for depositing a graded composition primer layer of this invention, along with a conductor coating. FIG. 2a shows in more detail the magnetron source for depositing the primer layer in the sputter coater of FIG. 2.

FIG. 3 shows a representative X-ray photoelectron spectroscopy (XPS) plot of the compositional grading of a primer layer deposited by the sputter coater of FIG. 2.

FIG. 4 shows a representative XPS plot of the compositional variation across the combined thicknesses of a graded composition primer layer of this invention and a conductor layer.

FIG. 5 shows a representative XPS plot of the compositional variation across the combined thicknesses of an ungraded primer layer not according to this invention and a conductor layer.

DESCRIPTION OF PREFERRED EMBODIMENTS

The present invention improves the bonding characteristics of a conductor to a substrate through the use of a graded composition primer layer. The term "bonding characteristics" refers to both the strength of the bond itself under normal ambient conditions and the environmental stability of the bond, that is, the ability of the bond to retain useful bond strengths at extreme environmental conditions, such as high temperatures or high humidities.

The composition of the primer layer is "graded," that is, it continuously varies across its thickness so that at its surface facing the conductor (the "outer" surface) it consists predominantly of a first metal which is the same metal as the metal of the conductor. Conversely, at the surface facing the substrate, or the "inner" surface, it consists predominantly of a second metal, which is chosen to be different from the first metal. (As used herein, the term metal includes not only metallic elements, such as copper, chromium, titanium, gold, or silver, but also alloys, such as nichrome or stainless steel.) The grading ensures that at the conductor-primer layer interface a bond is formed essentially between the first metal and the conductor, while at the substrate-primer layer interface a bond is formed essentially between the second metal and the interface, thereby avoiding problems which may arise with ungraded primer layers (e.g., a homogeneous layer of chromium such as discussed above) if the bonding characteristics of the substrate to the primer layer material are acceptable, but the bonding of the primer layer material to the conductor leaves something to be desired, or vice versa.

The first metal is selected to be the same as the metal of the conductor, so that the likelihood of failure at the conductor-primer layer interface is minimized, or one which alloys readily with the conductor. Exemplary preferred first metals are copper, gold, aluminum, silver, palladium, platinum, rhodium, and nickel. Copper is especially preferred.

The second metal is selected for its desirable bonding characteristics to the particular substrate being used. Generally, metals which form stable metal-oxygen or metal-carbon bonds are preferred. Exemplary preferred second metals are chromium, nickel, aluminum, titanium, and alloys thereof; nichrome; and stainless steel. Chromium is especially preferred.

In a preferred embodiment, the primer layer consists essentially of the first metal at its outer surface and of the second metal at its inner surface. The manner in which the composition varies across its thickness is not especially critical, provided it is continuous. The variation may be linear or nonlinear. The importance is to avoid discontinuities at which bond failures may occur. An approximately linear variation is preferred because it is the simplest one to implement. Also, a linear variation distributes any crystal structure stresses over a greater distance. The thickness of the primer layer also is not critical, but preferably it is between about 50 and about 500 Å thick, more preferably between about 100 and about 200 Å thick. A typical compositional profile for a chromium-copper primer layer in combination with a copper conductor is shown in FIG. 1.

The primer layer of this invention can be used with a variety of substrates, for example polymers (including reinforced ones such as glass fiber reinforced epoxies), ceramics, glasses, and other printed circuit or circuit board materials. A preferred substrate is polyimide, such as Kapton polyimide from du Pont, although other polyimides may also be used. Other polymers which may be used include polyester (e.g., poly(ethylene terephthalate)), poly(ether imide) (e.g., Ultem resin from General Electric), poly(arylene ether ketone) (e.g., PEEK from ICI), and poly(ether sulfone). The substrate may be in film or sheet form or in any other form onto which a conductor pattern is to be deposited. A clean and uniform substrate surface is desirable. Accordingly, it is advisable to surface treat the substrate by glow discharge, corona treatment, or other surface treatment technique known in the art to remove any residual traces of organic contaminants and to provide a uniform deposition and bonding surface.

As mentioned hereinabove, the conductor is made of the first metal. Accordingly, preferably the conductor is selected from the group consisting of copper, gold, aluminum, silver, and nickel, with copper being especially preferred.

A preferred combination is polyimide substrate, chromium-copper primer layer, and copper conductor. Where the conductor also has a sensing purpose, as opposed to a purely current carrying purpose, it commonly is then made of a sensor material such as nickel, gold, platinum, or palladium. An example of a preferred combination for the latter purpose is polyimide substrate, chromium-palladium primer layer, and palladium conductor (also functioning as a sensor element).

A preferred method for depositing the primer layer of this invention and the conductor is by sputtering, in particular magnetron sputtering. Other techniques suitable for the deposition of thin films can be used, for example spray pyrolysis, chemical vapor deposition, ion plating, laser deposition, vacuum evaporation, and the like.

Electroless deposition or chemical plating also can be used for the deposition of the conductor. The conductor may also be deposited by a combination of sputtering and plating techniques, in which the primer layer and a thin layer of the conductor are deposited by sputtering. Then the conductor is plated up to the desired final thickness. This combination technique advantageously avoids oxidation of the primer layer, but yet provides a conductor layer sufficiently thick to carry the electroplating current. (Sputtering the entire thickness of the conductor layer may be unattractive as it is generally a slower deposition process than electroplating.)

The practice of our invention can be more readily understood by reference to the following examples, which are provided by way of illustration and not of limitation.

EXAMPLE 1

A sputter coater was used to deposit a chromium-copper graded composition primer layer and copper conductor onto Kapton polyimide film. This coater is shown schematically in FIG. 2.

Referring to FIG. 2, sputter coater 1 has payout and takeup rolls 2 and 3, respectively, for substrate film 4, which is to be coated. Film 4 is carried by chill drum 5 past magnetron sources 6a and 6b, having power sources 7a and 7b, targets 8a and 8b, and gas inlets 9a and 9b, respectively. Target 8a is a composite chromium/copper target, for the deposition of a graded chromium-copper primer layer. Target 8b is a copper target, made of oxygen-free high conductivity ("OFHC") copper, for the deposition of a copper conductor layer. Monitors 10 provide information on the resistance, thickness, or other properties of coatings being applied.

The layout of magnetron source 6a and its composite target 8a and its manner of operation is shown in greater detail in FIG. 2a. Target 6a is made half of chromium and half of copper, divided along a symmetry axis perpendicular to the direction of travel of film 4. A shield 11 (not shown in FIG. 2) is installed along the symmetry axis as shown, to substantially limit the region of co-deposition of chromium and copper to the central portion of the deposition area, assuring a good gradient profile. A representative compositional variation as a function of distance from the chromium-rich edge of the target of coatings deposited from composite target 8a, as determined by X-ray photoelectron spectroscopy (XPS) of a coating deposited on a stationary substrate, is shown in FIG. 3.

Those skilled in the art will appreciate that two or more magnetron sources having targets of uniform composition can be arranged to deposit the same coating being deposited here by the single magnetron source 6a with its composite target 8a.

Specifically, a roll of Kapton polyimide (0.002 inches thick) was mounted inside sputter coater 1 and the chamber was evacuated to a pressure of less than $1 \times 10^{-5}$ Torr. A flow of argon (99.99% pure) was admitted via inlet 9a to establish a pressure of about 2 mTorr in the vicinity of target 8a. Similarly, argon was admitted via inlet 9b to establish a pressure of about 1.2 mTorr about target 8b. The film transport mechanism was activated to move the polyimide film past the magnetron sources at a speed of about 2.7 ft/min, the direction of motion being as shown by the arrows in FIG. 2 and 2a, that is, passing the substrate first over the chromium portion of target 8a, then over the copper portion, and lastly over copper target 8b. Sputtering was initiated from composite target 8a by applying a power of 2.0 kW at a negative DC voltage of 615 volts, and from copper target 8b by applying a power of 3.0 kW at a voltage of about 450 volts. By transporting the polyimide film through the regions of varying deposition fluxes, a primer layer composed substantially of chromium at the substrate interface and having increasing copper content in the direction away from the substrate interface is produced from target 8a. This primer layer is overlaid with pure copper from target 8b.

After the entire roll of the polyimide film had passed across both targets, power to composite target 8a was turned off and the polyimide film was passed over target 8b several times to increase the copper conductor thickness. The final sheet resistivity was 0.185 ohm/square.

Sheets of the resultant coated film were chemically plated to increase the copper conductor thickness to approximately 0.00025 inches and laminated, metal side up, to a composite backing sheet for testing.

EXAMPLE 2

For comparison, a similar polyimide/chromium/copper assembly was prepared, that is, one having a chromium primer layer (not according to this invention). The method of preparation was similar to that used in Example 1, except that the primer layer composition was not continuously graded from essentially chromium to essentially copper. Instead, there was an abrupt chromium to copper interface. This was accomplished by replacing the composite target with a chromium one.

Sheets of this comparison material were then chemically plated to increase the copper thickness to about that for the sheets described in Example 1.

EXAMPLE 3

In this Example, materials from Examples 1 and 2 are compared.

A representative XPS depth profile for material from Example 1 before plating is shown in FIG. 4, while a representative XPS depth profile for material from Example 2 before plating is shown in FIG. 5. It can be seen that the copper to chromium transition is much more abrupt in FIG. 5 than in FIG. 4.

Sheets from Examples 1 and 2 were environmentally tested at an elevated temperature and humidity (70° C., 83 % relative humidity) for 200 hr. The integrity of the chromium to copper bond was evaluated by peeling the plated layer from the substrate polyimide. The material of Example 1 had a peel strength of 8 lb/in (average of several samples) and failed at the polyimide surface by disruption of the polyimide surface. In contrast, the material of Example 2 had a lower peel strength of 7 lb/in (average of several samples) and failed at the chromium-copper interface, leaving behind visible patches of chromium on the substrate, apparently due to the penetration of oxygen and moisture along faults in the grains of the plated layer.

What is claimed is:

1. An assembly comprising a conductor supported by a substrate, comprising
   (a) a substrate;
   (b) a graded composition primer layer bonded to said substrate, comprising a first metal and a second metal different from said first metal and having a composition which continuously varies from a predominance of said first metal at the surface facing away from said substrate to a predominance of said second metal at the surface bonded to said substrate, said primer layer being between about 50 and about 500 Å thick; and
   (c) a conductor made of said first metal and bonded to said primer layer at the surface predominant in said first metal.

2. An assembly according to claim 1, wherein said second metal is selected from the group consisting of chromium, nickel, aluminum, titanium, and alloys thereof; nichrome; and stainless steel.

3. An assembly according to claim 1, wherein said second metal comprises chromium.

4. An assembly according to claim 1, wherein said first metal is selected from the group consisting of copper, gold, aluminum, silver, palladium, platinum, rhodium, and nickel.

5. An assembly according to claim 1, wherein said first metal comprises copper.

6. An assembly according to claim 1, wherein said primer layer consists essentially of said first metal at the first metal predominant surface and of said second metal at the second metal predominant surface.

7. An assembly according to claim 1, wherein said substrate is selected from the group consisting of glass, ceramic, or polymer.

8. An assembly according to claim 1, wherein said substrate comprises polyimide.

9. An assembly according to claim 1, wherein said substrate comprises polyimide, said first metal is copper, and said second metal is chromium.

10. A method of making an assembly comprising a conductor supported by a substrate, comprising the steps of
   (a) providing a substrate;
   (b) depositing onto said substrate a graded composition primer layer comprising a first metal and a second metal different from said first metal and having a composition which continuously varies from a predominance of said first metal at one surface to a predominance of said second metal at the other surface, said primer layer being deposited with the second metal predominant surface facing said substrate and having a thickness between about 50 and about 500 Å thick;
   (c) depositing onto the first metal predominant surface of said primer layer a conductor made of said first metal.

11. A method according to claim 10, wherein said second metal is selected from the group consisting of chromium, nickel, aluminum, titanium, and alloys thereof; nichrome; and stainless steel.

12. A method according to claim 10, wherein said second metal comprises chromium.

13. A method according to claim 10, wherein said first metal is selected from the group consisting of copper, gold, aluminum, silver, palladium, platinum, rhodium, and nickel.

14. A method according to claim 10, wherein said first metal comprises copper.

15. A method according to claim 10, wherein said primer layer consists essentially of said first metal at the first metal predominant surface and of said second metal at the second metal predominant surface.

16. A method according to claim 10, wherein said primer layer is deposited by sputtering.

17. A method according to claim 10, wherein said conductor is deposited by sputtering.

18. A method according to claim 10, wherein said conductor is deposited by a combination of sputtering and chemical plating.

19. A method according to claim 10, wherein said substrate is selected from the group consisting of glass, ceramic, or polymer.

20. A method according to claim 10, wherein said substrate comprises polyimide.

21. A method according to claim 10, wherein said substrate comprises polyimide, said first metal is copper, and said second metal is chromium.

* * * * *